United States Patent [19]

Östman et al.

[11] Patent Number: 5,786,782
[45] Date of Patent: Jul. 28, 1998

[54] MULTIPLEXED SIGNAL CONVERSION

[75] Inventors: Kjell Östman, Salo; Timo Kolehmainen, Oulu; Harri Jokinen, Hiisi, all of Finland

[73] Assignee: Nokia Mobile Phones Ltd., Salo, Finland

[21] Appl. No.: 768,430

[22] Filed: Dec. 18, 1996

[30] Foreign Application Priority Data

Jan. 5, 1996 [FI] Finland ............... 960066

[51] Int. Cl.$^6$ ............... H03M 1/00; H04B 1/38
[52] U.S. Cl. ............... 341/141; 341/110
[58] Field of Search ............... 341/141, 110, 341/155, 118

[56] References Cited

U.S. PATENT DOCUMENTS

| | | | |
|---|---|---|---|
| 4,638,248 | 1/1987 | Schweickert | 324/76 |
| 5,191,331 | 3/1993 | Karema et al. | 341/131 |
| 5,227,794 | 7/1993 | Whikehart | 341/141 |
| 5,248,972 | 9/1993 | Karema et al. | 341/143 |
| 5,311,179 | 5/1994 | Vaisanen et al. | 341/118 |
| 5,327,132 | 7/1994 | Whitecar et al. | 341/141 |
| 5,331,321 | 7/1994 | Mannonen | 341/110 |
| 5,627,536 | 5/1997 | Ramirez | 341/141 |

FOREIGN PATENT DOCUMENTS

0478071A2  4/1992  European Pat. Off. .

Primary Examiner—Howard L. Williams
Assistant Examiner—Peguy JeanPierre
Attorney, Agent, or Firm—Perman & Green, LLP

[57] ABSTRACT

A/D and D/A converters are effectively utilized in a mobile phone, for example, by multiplexing the signals before the conversion. Both time division multiplexing and frequency division multiplexing can be used. When frequency division multiplexing is used, the IF signal (D) coming from the radio part and the baseband signal (A) coming from the microphone are summed (30) before the A/D conversion (31). The converted signal (K, L) is directed through filters (32, 34) in separate branches to digital signal processing (28). After that, the coded microphone signal (I, Q) is modulated (41, 42) to the intermediate frequency and added to the received, decoded baseband signal (M). The summed signal is directed to a D/A converter (45) and thereafter the signals are again separated by means of filters (46, 47). When time division multiplexing is used, the arrangement can also be used for measuring other signals of the mobile station.

27 Claims, 4 Drawing Sheets

MULTIPLEXED SIGNAL CONVERSION

FIELD OF THE INVENTION

The present invention relates to multiple use of analog-to-digital converters and, more specifically, to a method for digital signal processing of two analog input signals, whereby the input signals are converted by an analog-to-digital converter to digital form before digital signal processing and by a digital-to-analog converter back to analog form after the signal processing. The invention is preferably applied in a mobile phone, especially a Global System for Mobile Communication (GSM) mobile phone. The invention also relates to a circuit arrangement for implementing the method.

BACKGROUND OF THE INVENTION

Figure 1:
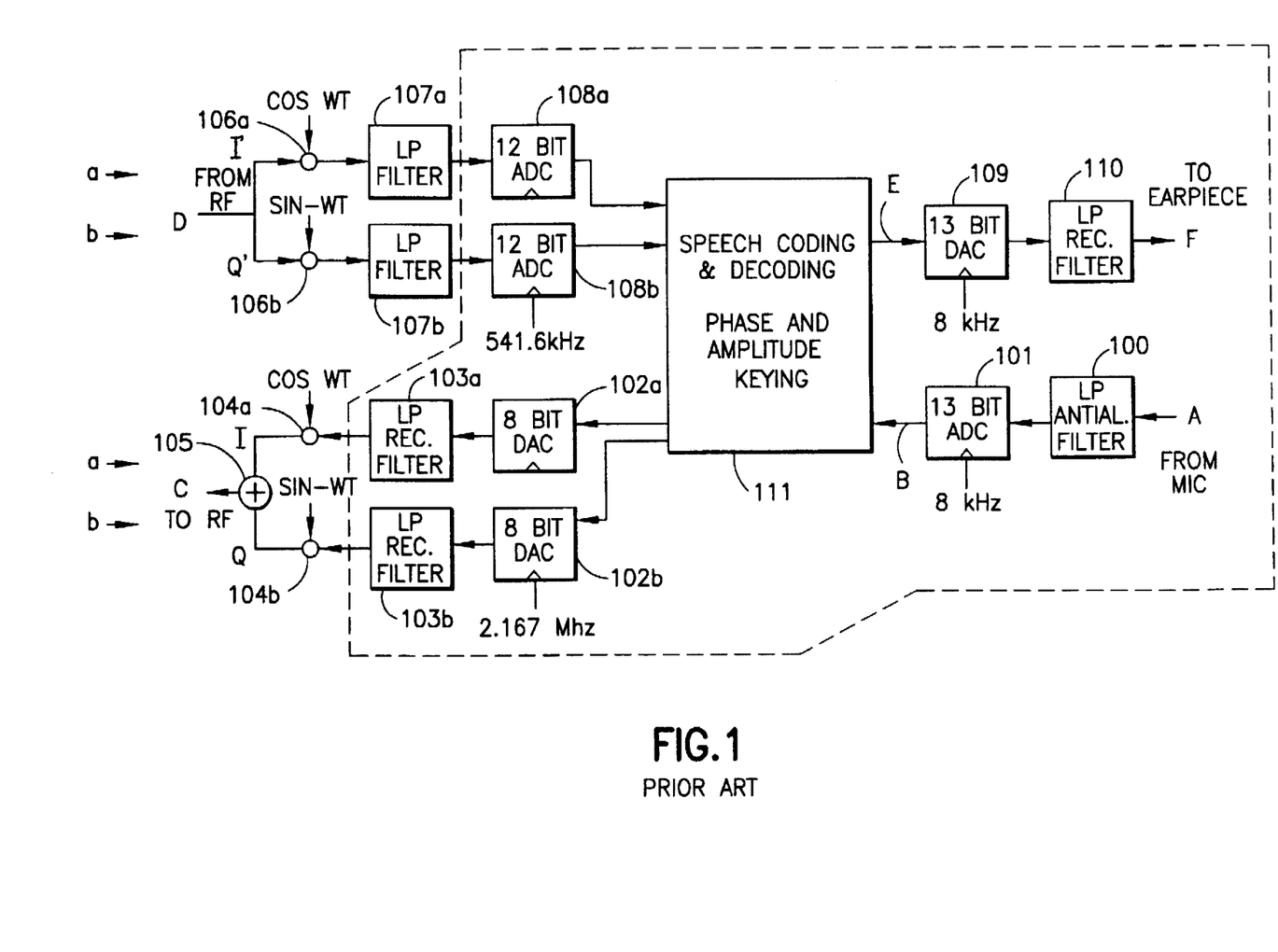
FIG. 1 shows a prior art solution of a baseband circuit arrangement in a transmitter-receiver, as was described above.

FIG. 1 shows a prior art arrangement for implementing the above in a transmitter-receiver, a typical and straightforward solution in a digital mobile phone. An analog speech signal A from a microphone is lowpass filtered by an antialiasing filter 100 and converted into a digital signal B by an analog-to-digital converter 101, whereafter it is coded (speech coding), and its phase and/or amplitude is processed in the processing circuit 111 according to a predetermined coding and modulation method (for example, GMSK, QPSK etc.). The coded signal is converted into a typically complex signal, in which branch "a" provides the in-phase component I and branch "b" provides the quadrature component Q. The conversion is done by means of a digital-to-analog converter 102a, 102b, lowpass reconstruction filtering 103a, 103b and mixing 104a, 104b. The local oscillator frequencies in 90 degree phase shift in relation to each other, cos(ωt) and sin(−ωt), respectively, are brought into the mixers 104a and 104b. The sample frequency of a 13-bit ananog-to-digital converter 101a, 101b is typically 8 kHz, and the sampling frequency of the 8-bit digital-to-analog converter 102a, 102b is 2.167 MHz. The modulation results I and Q are summed in the adder 105, and the resulting intermediate frequency C is directed into RF blocks, in which the signal is used to modulate a radio-frequency carrier wave (not shown in FIG. 1).

Similarly, FIG. 1 shows how a received intermediate frequency signal D is directed from the RF blocks (not shown) into two branches "a" and "b", where the signal is demodulated 106a, 106b, into a complex baseband signal I', Q', filtered by lowpass filters 107a, 107b, and then directed via an analog-to-digital conversion 108a, 108b to the digital signal processing circuit 111 for decoding. The decoded signal E appearing as the output of circuit 111 is directed via a digital-to-analog conversion 109 and lowpass filtering 110 to a received analog speech signal F to the telephone earpiece. It is to be noted that the signals A and F can also be other than speech, for example data, in which case no coding/decoding takes place in block 111.

In FIG. 1, the baseband frequency circuits are separated by a broken line as block BB.

It can be seen from FIG. 1 that a typical transmitter-receiver solution requires three analog-to-digital converters 101, 108a, 108b and three digital-to-analog converters 102a, 102b, 109. These conversion circuits, and particularly the analog-to-digital converters, constitute a considerable cost in a transceiver, such as a mobile phone. The minimization of the number of conversion circuits would therefore bring a definite cost advantage. In addition, reducing the number of circuits also reduces the amount of space required.

It is well known that if the first modulation (104a, 104b) to an intermediate frequency (which produces signal C, for example) and correspondingly the final demodulation (106a, 106b) of signal D from an intermediate frequency to a baseband frequency is done digitally, the digital-to-analog converters 102a, 102b can be replaced in the forward direction of the signal by a digital-to-analog converter (not shown) fitted after the modulation 104a, 104b, and correspondingly the analog-to-digital converters 108a, 108b can be replaced by an analog-to-digital converter (not shown) fitted before the modulation 106a, 106b. Therefore, in signal processing corresponding to the case shown in FIG. 1, two A/D converters and two D/A converters are required, i.e. one A/D converter and one D/A converter in the transmission branch and one A/D converter and one D/A converter in the receiving branch, respectively. In practice, however, this solution has not very often been implemented.

SUMMARY OF THE INVENTION

It is an objective of the present invention to provide a solution by which the number of A/D and D/A converters can be reduced in the baseband signal processing circuit (BB).

This objective is achieved by the invention, according to which the two analog input signals of the circuit arrangement, such as the speech signal to be transmitted and the baseband signal received from the radio block are combined by means of multiplexing, the multiplex signal is converted from analog to digital, the digitized, combined signal is demultiplexed, and the outcome of the process, the digital equivalents of the input signals, are directed in different branches to each said signal processing. Correspondingly, the digitally processed output signals of the signal processing are combined into a second combined signal, which is converted from digital to analog, and the analog, combined signal is demultiplexed, and the analog signal is branched off into two analog output signals, such as a baseband signal to be transmitted and a speech signal received. In other words, the same analog-to-digital converter can be used, for example in a mobile phone, for converting both the speech signal from the microphone and the received signal from the radio part into a digital signal. Similarly according to the invention, the same digital-to-analog converter is used for converting both the coded speech signal and the received decoded signal back into an analog signal. Thus according to the invention, the use of A/D and D/A converters is multiplexed. There are many ways to implement this.

In the first embodiment of the invention, the conversion of the signals is done with time division multiplexing. This multiplexing relates particularly to the analog-to-digital conversion of the arrangement presented.

In the second embodiment of the invention, the same analog-to-digital converter is used to process different signals in the TDMA (Time Division Multiple Access) systems, but all the signals are not being converted all the time, but when there is competition between the signals, some samples of the second signal are ignored. In the preferred embodiment, some samples of the signals received from the radio path are ignored when there is competition between the signals. By competition between signals it is meant that in a certain period of time, the amount of samples to be converted exceeds the conversion capacity.

In the third embodiment of the invention, the analog-to-digital conversion is done with frequency division multiplexing. In this embodiment, the speech signal to be transmitted, which is essentially at baseband frequency, and the received signal, which is at intermediate frequency, are summed before the analog-to-digital conversion. After the conversion, the signals are separated by digital filtering. After the digital processing, the second set of signals is modulated to the intermediate frequency, and the digital-to-analog conversion is correspondingly performed on a combined, frequency multiplexed signal.

BRIEF DESCRIPTION OF THE DRAWINGS

In the following, the invention will be described in more detail by means of exemplary embodiments, illustrated by a mobile phone application and with reference to the appended drawings, in which.

DETAILED DESCRIPTION OF THE INVENTION

In the following, the exemplary embodiment of a digital mobile phone is considered in more detail, starting from the analog-to-digital conversion. In prior art solutions, the speech signal is generally converted at 13-bit precision 8000 times a second, as is shown in FIG. 1. Alternatively, the dynamic range of the speech signal is reduced by carrying out a linear/logarithm conversion by, for example, directing the speech signal through a logarithmic amplifier, whereafter 8-bit samples are sufficient to represent a speech signal. In other words, an 8-bit analog-to-digital converter is used. Before the conversion, the speech signal must be filtered in an antialiasing filter, because speech may contain frequencies which are over 4 kHz.

The received signal D in FIG. 1 is converted at an essentially higher frequency, for example at 540 kHz in a GSM equipment, into 12-bit samples, and in a DAMPS equipment at 48.6 kHz into 12-bit samples. Because the number of bits per sample is thus relatively high, Sigma Delta Converters (SDC) are generally used in these conversions carried out in the intermediate or baseband frequency domains, in which conversion costs are relatively low, particularly when the signal is to be converted into a number with more than 10 bits.

Figure 2:
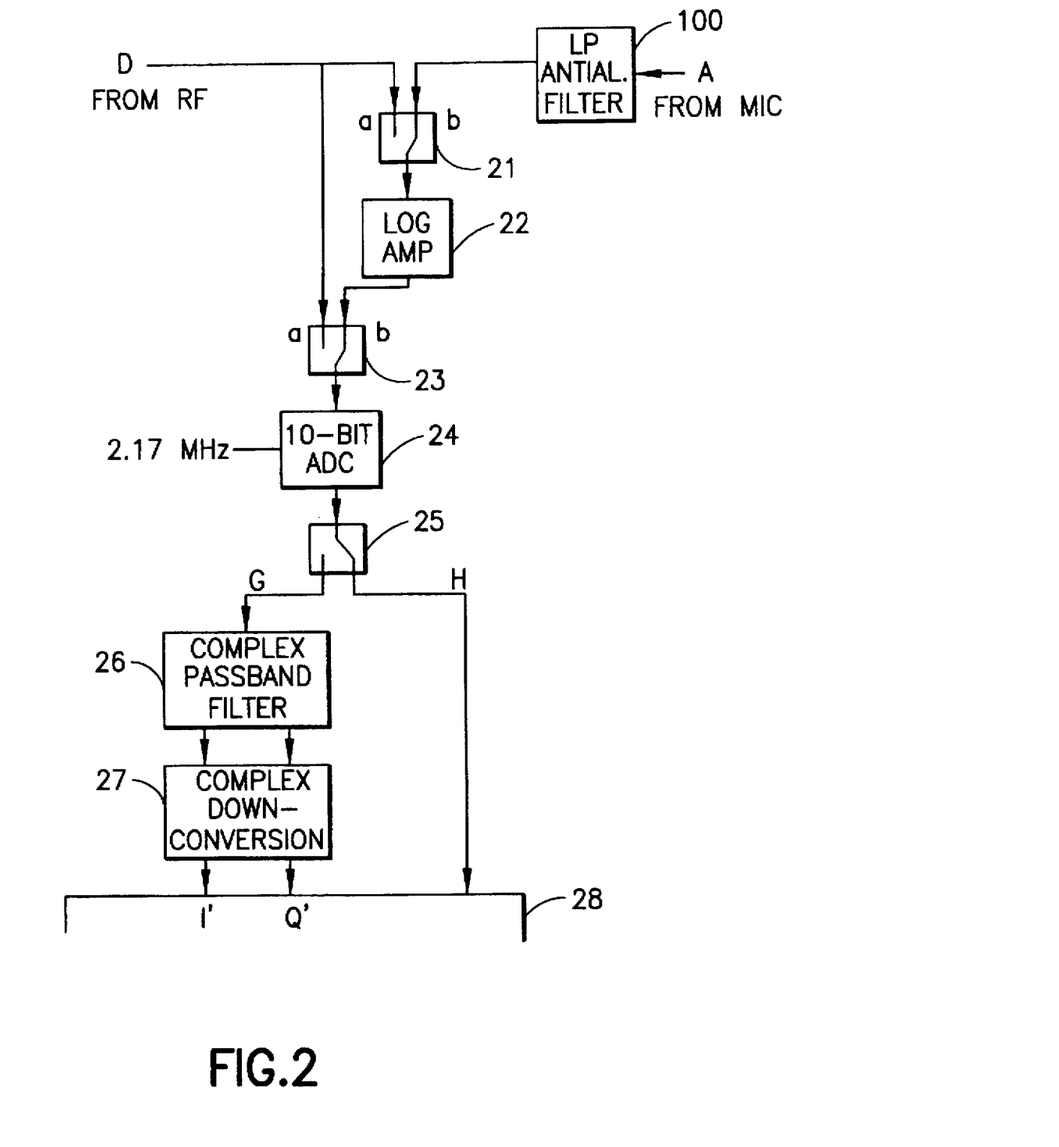
FIG. 2 shows a circuit arrangement according to the invention, in which the analog-to-digital conversion is done with time division multiplexing.
Figure 3A:
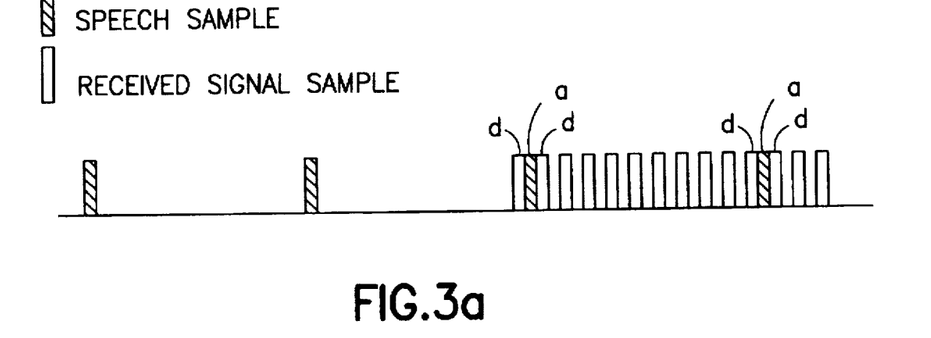
FIG. 3a shows one method for multiplexing the speech signal and the received signal.

In the following, the analog-to-digital signal conversion according to the invention will be described in more detail with reference to FIG. 2, and here particularly with the time division multiplexing principle. Here the input signals A and D, that is, the speech signal A to be transmitted and the intermediate frequency signal D received from the radio block are multiplexed, which means that they are temporally interlaced one after another by means of switching arrangements as shown in FIG. 3a. In FIG. 2, a signal A coming from the microphone is directed to the b-input of a first switch 21, and the intermediate frequency signal D coming from the radio part is directed to the the a-input of a second switch 23, but also to the a-input of the first switch 21 for RSSI measurement, as will be described below. The signal selected by the first switch 21, normally a speech signal A, is directed to a logarithmic amplifier 22 and from there to the b-input of the second switch 23. The signal selected at any given time by the second switch 23 is directed to a 10-bit analog-to-digital converter 24, the clock signal of which, controlling the sampling, is produced by means of a separate oscillator circuit (not shown). After the A/D conversion, the digitized, combined signal is directed to a switch unit 25, where the signal is demultiplexed. The switch 25 directs the digitized speech signal H to the coding and decoding unit 28. The result of the analog-to-digital conversion of signal D coming from the radio block is directed as a signal G controlled by the switch 25 to blocks 26 and 27, and further through a complex bandpass filter 26 and complex demodulation 27 as digital signals I' and Q' to the unit 28.

In addition, in the case of FIG. 2, the samples of the received signal D can be directed through the a-input of switch 21, switch 21 and a logarithmic amplifier 22, and further through switch 23, A/D converter 24 and switch 25 directly to the digital signal processing unit 28, where the digitized signal D can be processed for the RSSI (Received Signal Strength Indication) measurement. Thus it is not necessary to specify suitable settings for the AGC circuit for the RSSI measurement before the measurement is done, because the whole dynamic range of the signal can be handled by a logarithmic amplifier. Alternatively, the RSSI signal can be taken from the output of the logarithmic amplifier 22 and routed from there directly to another suitable circuit, without routing the signal thus selected through an analog-to-digital converter 24.

In the case of FIG. 2, the signals are processed with time multiplexing. In that case, it is not possible to use SDC converters in the analog-to-digital conversion unit 24, because the SDC converters perform a recursive time-continuous conversion. Instead the conversion is to be done using an instantaneous converter, such as a flash converter, in which all the different levels to be converted are separated by means of comparators. When the amount of bits increases, the flash converter requires a relatively large integrated circuit, because the number of comparators increases in the proportion $2^n$, where n is the number of bits, and the area of the circuit becomes large. Thus the number of bits should be reduced so as to make this approach feasible. As concerns the speech signal, the number of bits is reduced by using a logarithmic amplifier 22 in a known manner, applied before the analog-to-digital conversion 24. Alternatively, it would be possible to take samples continuously at a high frequency, in which case bits can be added by filtering. In the latter method, power consumption would increase, but on the other hand, the requirements for the anti-aliasing filter 100 could be considerably reduced.

One difficulty of the conversion method shown in FIG. 2 above is the fact that the time to be used for the analog-to-digital conversion is half of that used in the prior art solution, such as the circuit arrangement shown in FIG. 1.

Figure 3B:
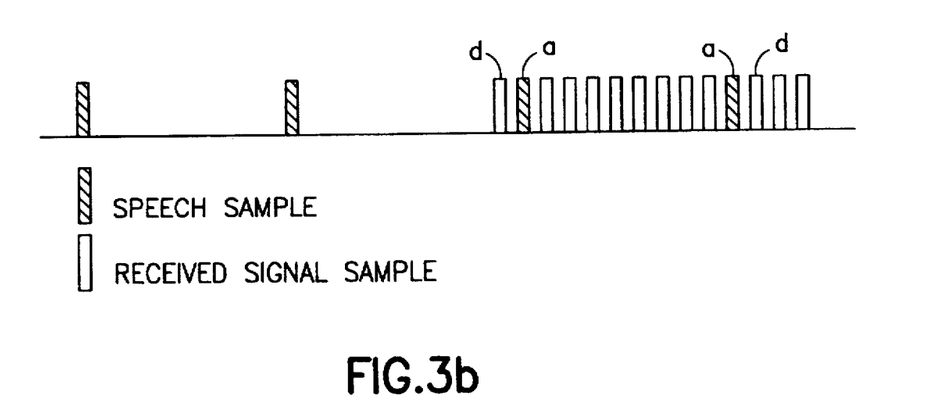
FIG. 3b shows another method for multiplexing the speech signal and the received signal, in which the sampling is done less frequently.

This problem can be overcome by alternating the sampling in a manner such that one of the signals is alternately selected for coding, and the other one is ignored, FIG. 3b. FIG. 3a shows a situation in which the signals d, a, d are in succession. In FIG. 3b a situation like this is avoided, because the processing is done less frequently by leaving out one of the signals d. However, this procedure can only be applied in TDMA systems. In this case, the circuit arrangement is also in accordance with the principle of FIG. 2.

In the GSM system, for example, the alternation described above can be regarded as a preferred embodiment. In the GSM system, the occupation efficiency of the TDMA signal is less than ⅛, in which case the signal coming from the radio path would occupy less than 12% of the time of the analog-to-digital converter, and the converter could be used for digitizing the speech signal for the rest of the time. The length of the received time slot is 0.577 ms, during which an average of 4.6 samples are taken from the speech signal. There are two alternatives in the selection process: an average of 4.6 speech samples can be ignored, or an average of 4.6 samples of the received signals can be ignored.

In the GSM system, the length of the speech frame is 20 ms, and it contains 160 samples. This means that within one frame, an average of 20 samples out of 160 would remain unconverted. A deficiency of this order would result in a deterioration of speech quality, which is hardly acceptable.

The other, more preferred form of alternation is then to ignore the samples received from the radio path. Typically, the received signal is sampled at twice the bit rate. As the received slot is 148 bits in GSM, an average of 4.6 samples out of 296 would be ignored. This would result in a signal power to error power ratio of $10*\log(4.6/296)=-18.1$ dB, which probably is tolerable as such. A better value can be obtained by using higher sampling frequencies, whereby the above ratio would improve by as much as 5 dB, without causing the sampling frequency to be disproportionately high. To further enhance the signal power to error power ratio, interpolation could be employed, whereby the samples ignored in the alternation could be reconstructed afterwards. An interpolation of this kind can be carried out in a manner known as such at relatively low costs.

In the last mentioned alternation method, a flash converter is preferred, as was described earlier. The simple RSSI measurement mentioned above can also be applied here.

In the above described examples of the first and the second embodiment of the invention, it has been assumed that the received signal is demodulated to the baseband frequency digitally. It should be noted that these embodiments of the invention would also function in a circuit arrangement in which the received signal is first demodulated to the baseband frequency and sampled after that. In this case, two A/D-converters are required for the sampling of the received signal, and one of the converters can alternate with the speech signal by time division multiplexing.

It has also been assumed in the examples that a linear-to-logarithm conversion is carried out on the speech signal. In both embodiments, it is also possible to carry out an analog-to-digital conversion on the linear speech signal. However, an arrangement like this requires a 13-bit converter, which has a high operating frequency.

A third possible implementation of the analog-to-digital conversion is a frequency multiplexed A/D conversion of the signals. This method entails a digital conversion of the received IF signal to a lower frequency using a method known as such, which also has many advantages. In this method, the sampling is done before the final frequency conversion, whereby the analog-to-digital conversion is performed on an IF signal.

Figure 4:
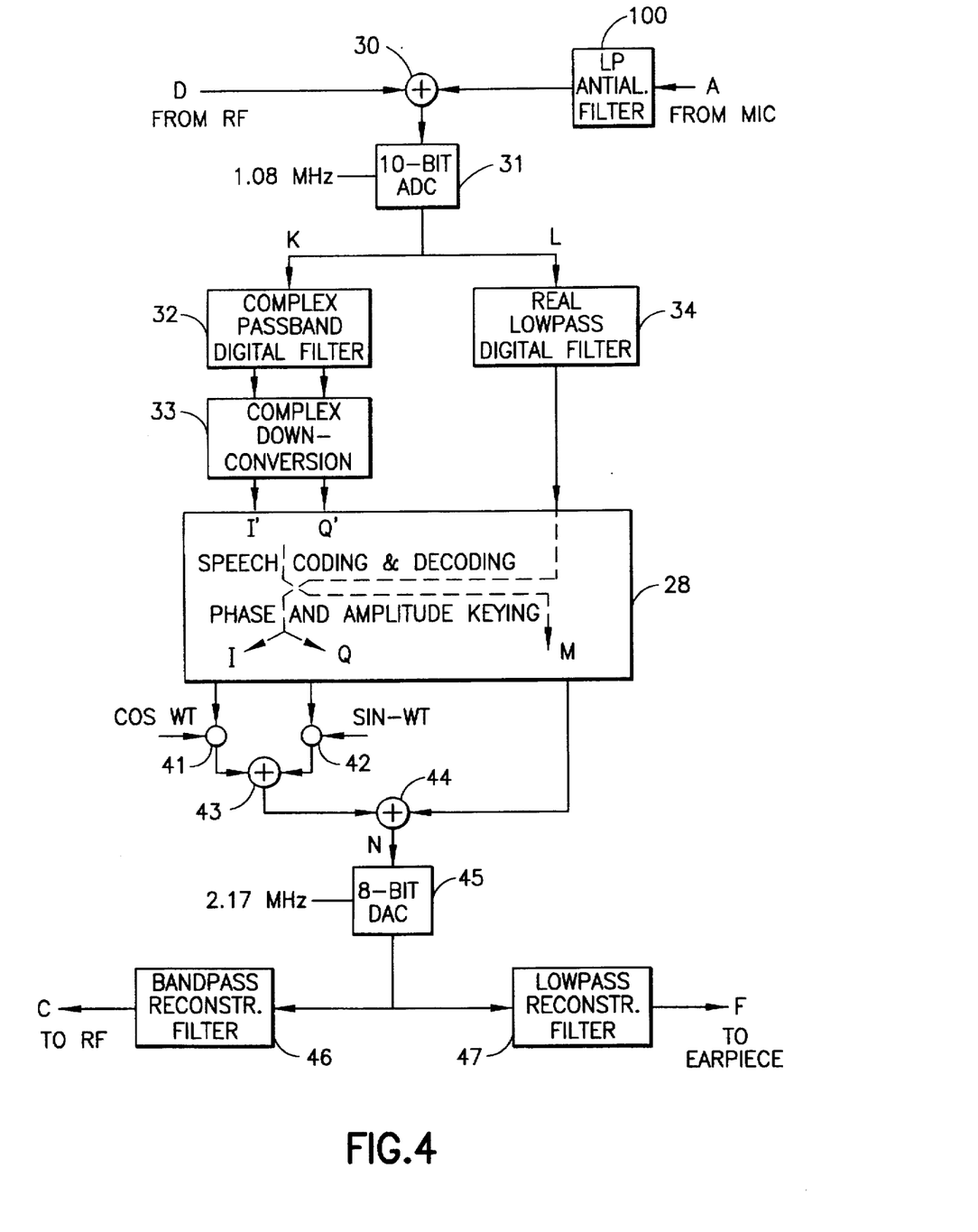
FIG. 4 shows a circuit arrangement according to the invention, in which the analog-to-digital conversion is done with frequency division multiplexing, and in which the coded/decoded signals are converted back to analog by a frequency division multiplexed D/A conversion.

Because the speech signal A is essentially at baseband frequency, it can be added to signal D, which is received from the radio path and converted to an intermediate frequency, in adder 30, FIG. 4. Thus these signals are processed with frequency division multiplexing in the analog-to-digital converter 31. In this process, it is required that the intermediate frequency is sufficiently high and that the IF signal is duly selectivity filtered.

When frequency division multiplexing is used, the signals can be summed as analog signals in the adder 30, from which the summed signal is directed to the A/D-converter 31. In this example, the conversion is carried out in a 10-bit flash converter at the sample frequency 1.08 Mhz. The result of the conversion is a signal containing 10-bit symbols. The output signal of the converter is branched off to two signals K and L, which are filtered by separating filters 32 and 34. The digitized signal D is directed as signal K to the complex bandpass filter 32 for digital signals, and from there further to the complex frequency conversion 33, the output of which is constituted by the digital signals I' and Q'. They are then directed to the coding and decoding unit 28. The digitized signal A is directed as signal L to the real lowpass filter 34 for digital signals, the filtering result of which is directed to the digital signal processing unit 28.

With regard to the processing of the received signal D, filtering carried out for the separation of the added signals does not entail any additional steps, because in any case the downward conversion of the digital intermediate frequency must be complemented by an antialiasing filter, in which the component created in the double intermediate frequency is removed. The intermediate frequency signal must be filtered out before the digitized speech signal L is processed. Because the sampling has now taken place at a high frequency, the attenuation requirements of the antialiasing filter can be considerably reduced or the filter can be left out and the signal separating filters can be used instead for limiting the frequency band of the speech signal as well.

In connection with frequency division multiplexing, the speech signal A cannot be logarithmically amplified before the A/D conversion, and thus the most straightforward application would require a 13-bit analog-to-digital conversion. A sigma delta conversion could be applied in this method, and it would be ideal, because the received signal D requires a higher sampling frequency but fewer bits, and it would be filtered less, whereas the speech signal requires a lower sampling frequency but more bits, and it would be filtered more. However, a sigma delta converter, which would perform these operations, is not necessarily easily achievable, because a sigma delta modulator would require a dual notch noise shaping filter. Thus under the circumstances, the preferred embodiment of the invention uses a 10-bit flash-type analog-to-digital converter 31. When required, higher precision can be achieved by sampling at an excessive frequency and by arranging a corresponding, appropriate filtering of the digitized signal. In order to achieve 13-bit precision for the speech signal, the sampling frequency must be at least 256 kHz. In this case, the filtering would naturally be combined with the signal separation filtering 34.

In the following, the digital-to-analog conversion will be described with reference to FIG. 4, and it can be done in a similar manner as the analog-to-digital conversion described above, by increasing the signal frequency digitally. The technique of digital upconversion is known as such and has also many other advantages, which are not necessarily related to the invention.

In FIG. 4 it is to be noted that the signals coming from the radio part are directed as digitized signals I', Q' to the signal processing circuit 28 for decoding and processing, and the decoded speech signal comes out as signal M. Correspondingly, the speech signal L is coded and keyed for transmission, and comes out as a complex output signal I, Q.

According to the invention, the frequency of the signal to be transmitted is converted upwards to the intermediate frequency. In FIG. 4 this is shown in a manner such that the signal processing unit 28 forms the output signals I and Q of the coding and decoding unit from the digitized speech signal L. The output signals I and Q are then directed to the modulators 41 and 42. Modulations to the intermediate frequency are carried out on the signals cos(ωt) and sin(−ωt) respectively, in a similar manner as show n in FIG. 1. The outputs of the modulators 42, 43 are directed to the adder 43, and the combined signal, which is the output of the adder, is directed to the first input of the adder 44, the second input of which is the decoded, received signal M. The output signal N of the adder 44 is directed to the 8-bit digital-to-analog converter 45. The analog output signal of the converter 45 is branched off to the bandpass filter 46 and from there further to the radio part (not shown) as signal C for transmission, and to the lowpass filter 47 and from there to the earpiece (not shown) as signal F. The last mentioned filters 46, 47 do not constitute a considerable extra cost, because analog reconstruction filters are generally used after digital-to-analog converters in any case (cf. filters 103 and 110 in FIG. 1).

In the above embodiment of the invention, the digital-to-analog converter must convert the signal continously at a high frequency, which is typically 4 or 8 times the symbol rate. In the GSM system, the conversion frequency would then be 1.083 MHz or 2.166 MHz, in which case high power consumption might be a drawback of the embodiment.

Another possibility in a TDMA system would be to use separate conversion frequencies, on one hand during the time when there is no transmission because of the frame structure of the TDMA system (for example, 8 kHz), and on the other hand, during the time when there is transmission (in a GSM system, the conversion frequency would then be 2.166 MHz, for example). In this case, the converter must be a 13-bit converter. In other words, the first sample clock frequency is used in the digital-to-analog conversion 45 when the combined signal N to be converted contains an intermediate frequency output signal, and the second sample clock frequency is used when the combined signal N to be converted does not contain an intermediate frequency output signal. This can be implemented in a manner such that the transmission status is used to control a switch that switches the clock signal required in each case for the D/A conversion circuit 45.

Yet another possibility is to use separate clocks (8 kHz and 2.166 MHz) in the manner described above, and while there is no transmission, the speech signal is subjected to a linear-to-logarithm conversion before the digital-to-analog conversion. After the digital-to-analog conversion 45, the signal is directed to an antilogarithmic amplifier (not shown). In this case, it would be possible to use an 8-bit converter, because the linear-to-logarithm conversion replaces the missing bits when there is no transmission, and oversampling and filtering replace the missing bits when there is transmission.

As one embodiment of the invention, it can be mentioned that the analog-to-digital converter of the arrangement can also be employed to convert other, third signals of a mobile station for measurement or other processing. Signals like that include, for example, the voltage of the power source used in the mobile station, the temperature measurement signal and signals received from the mobile station accessories. In time multiplexed conversion, the analog-to-digital conversion of such a signal is performed during a period of time when a conversion of the speech signal is neither required for the burst to be sent nor for the conversion of the burst received. By way of example, the arrangement can be implemented as shown in FIG. 2, whereby there is between the switch 23 and the analog-to-digital converter 24 a third switch, by which either a speech signal or a received signal from swich 23 or the above mentioned third signal can be selected to the input of the analog-to-digital converter.

In the above, the principles of the invention have been described with regard to signal processing. It is clear to a person skilled in the art that a method according to the invention can also be used in other devices, in which an economical way to process signals is sought for, especially when the signals to be processed are duplex, and successive A/D and D/A conversions are required.

For example, the switch means shown in FIG. 2 can naturally be implemented in more than one manner, preferably as fast semiconductor switches, which can also be integrated into an A/D converter in a manner known to a person skilled in the art. Similarly, the different circuits shown as blocks, such as filters, adders, modulators etc. can be implemented using any known technique.

What is claimed is:

1. A method for digital signal processing of two analog input signals (A, D), in which the input signals (A, D) are converted by an analog-to-digital converter (24; 31) to digital form (G, H; K, L) before digital signal processing (28) and by a digital-to-analog converter (45) back to analog form after the signal processing, characterized in that before the digital signal processing:

a) the analog input signals are combined (23; 30) by multiplexing into a combined multiplex signal, b) an analog-to-digital conversion (24; 31) is performed on the combined multiplex signal, and c) the A/D-converted, digitized combined signal is demultiplexed (25; 32, 34) into two separate digital signals (G, H; K, L), which are directed in different branches to each said signal processing (28); wherein a first one of said analog input signals forms a part of a reception signal path and a second one of said analog input signals forms a part of a transmission signal path.

2. A method according to claim 1, characterized in that in addition, after the digital signal processing (28):

d) the processed digital signals are combined (44) into a combined digital signal (N), e) a digital-to-analog conversion (45) is carried out on the combined digital signal (N), and f) two distinct analog output signals (C, F) are separated (46, 47) from the combined analog signal resulting from the digital-to-analog conversion.

3. A method according to claim 1, characterized in that in the step a) multiplexing is carried out as time division multiplexing by directing the output signals (A, D) in a predetermined order through switch means (23) alternatively to the analog-to-digital conversion (24).

4. A method according to claim 3, characterized in that the first analog input signal is a baseband speech signal (A) and the second input signal is a TDMA signal (D) from the reception signal path and appearing in bursts, and that the switch means (23) is used to connect each second input signal burst (D) as such to the analog-to-digital conversion (24), and that the first input signal (A) is directed to the analog-to-digital conversion (24) only between the bursts.

5. A method according to claim 3, characterized in that
the first analog input signal (A) is a baseband speech signal and the second input signal is a TDMA signal (D) from the reception signal path and appearing in bursts, in which case the input signals (A, D) momentarily compete for access to the analog-to-digital conversion (24), and that in competition, the first input signal (A) is directed to the analog-to-digital conversion (24), and that the second input signal (D) is ignored during that time.

6. A method according to claim 5, in which the second input signal is a GSM signal (D) received from the radio path, characterized in that its sampling frequency is twice the symbol rate contained by the second input signal (D) or higher, and that in each competition, an average of 4.6 samples of the input signal (D) or less are ignored in each time slot of the received signal.

7. A method according to claim 5, characterized in that the ignored signal is interpolated.

8. A method according to claim 3, characterized in that the first signal (A) is directed by further switch means (21) at a multiplexing rate through a logarithmic amplifier (22) before the analog-to-digital conversion (24), and that the second input signal (D) is also directed by the further switch means (21) in alternating phases through the logarithmic amplifier (22) so that the output signal of the logarithmic amplifier in alternating phases is used to indicate the strength of the received signal (RSSI).

9. A method according to claim 1, in which the first analog input signal (A) is a baseband signal and the second input signal (D) is an intermediate frequency signal, characterized in that in step a) the multiplexing is done as frequency division multiplexing by summing the input signals in an adder (30), the output of which is directed to the analog-to-digital conversion (31).

10. A method according to claim 1, characterized in that the first analog input signal (A) is a baseband speech signal and the second input signal is a TDMA signal (D) from the reception signal path and appearing in bursts, and for the processing of a third signal, said third signal is converted into a digital signal at a time when an analog-to-digital conversion of said baseband speech signal or the received signal is not needed for the burst to be transmitted or received.

11. The use of a method according to claim 1, in a mobile station.

12. A method for converting two digital signals into an analog signal, characterized in that the digital signals are combined (44) into one combined digital signal (N), a digital-to-analog conversion (45) is carried out on the combined digital signal (N), and two distinct analog output signals (C, F) are separated (46, 47) from the combined analog signal resulting from the digital-to-analog conversion; wherein a first one of said digital signals forms a part of a reception signal path and a second one of said digital signals forms a part of a transmission signal path.

13. A method according to claim 12, characterized in that the processed digital signals are combined (44) by multiplexing into a combined digital signal (N), a digital-to-analog conversion (45) is carried out on the combined digital multiplex signal (N), and the combined digital signal (N) is demultiplexed by directing the output signal resulting from the digital-to-analog conversion (45) through switch means alternately to each output branch for creating the output signals (C, F).

14. A method according to claim 12, characterized in that a second processed signal (I, Q) is also modulated (41, 42) before combining (44), whereby the result of the combining is a frequency multiplexed signal (N), and that the combined signal (N) is demultiplexed by filtering the output signal resulting from the digital-to-analog conversion (45) by filters (46, 47).

15. A method according to claim 14, characterized in that the digital-to-analog conversion (45) uses a first sample clock frequency when the complex signal (N) to be converted contains an IF output signal, and a second sample frequency when the complex signal (N) to be converted does not contain an IF output signal.

16. A circuit arrangement for digital signal processing of two analog input signals (A, D), in which the input signals (A, D) are switched to an analog-to-digital converter (24; 31), which converts the input signals to digital form (G, H; K, L), and the converted signals (G, H; K, L) from its output are connected to a digital signal processing circuit (28), whereby output signals of the digital signal processing circuit (28) are connected to a digital-to-analog converter (45), in which the signals are converted back to the analog form, characterized in that the circuit arrangement comprises combining means (23; 30), which combine the analog input signals by multiplexing them into a combined multiplex signal, and the output signals of which are directed to the analog-to-digital converter (24; 31), the digitized combined output signal of which is connected to demultiplexing means (25; 32, 34), in which the digital equivalents (G, H; K, L) of the input signals (A, D) resulting from the demultiplexing are connected at different branches to each input of said signal processing circuit (28); wherein a first one of said analog input signals forms a part of a reception signal path and a second one of said analog input signals forms a part of a transmission signal path.

17. A circuit arrangement according to claim 16, characterized in that the circuit arrangement comprises a further combining means (44), which by multiplexing combines the digital output signals of the signal processing circuit (28) into a complex digital signal (N), whereby the digital combined signal (N) is connected to an input of a digital-to-analog converter (45), and the combined analog signal resulting from the conversion and appearing as the output of the digital-to-analog converter (45) is directed to separation circuits (46, 47), which separate two separate analog output signals (C, F) from the combined analog signal.

18. A circuit arrangement according to claim 16, characterized in that the combining means include switch means (23), which in a predetermined order alternately directs the input signals (A, D) to the analog-to-digital converter (24).

19. A circuit arrangement according to claim 18, characterized in that the first analog input signal is a baseband speech signal (A) and that the second input signal is a TDMA signal (D) from the reception signal path and appearing in bursts.

20. A circuit arrangement according to claim 19, characterized in that the switch means (23) at any given time connects the second input signal burst (D) as such to the input of the analog-to-digital converter (24), and that it connects the first input signal (A) to the input of the analog-to-digital converter (24) only between the bursts.

21. A circuit arrangement according to claim 16, characterized in that it further comprises means for directing a third signal to the input of the analog-to-digital converter (24) at such a time when conversion of said first input signal and said second input signal is not needed for transmission or reception, for digitizing said third signal for further processing.

22. A circuit arrangement according to claim 21, characterized in that said third signal is the output voltage of a power source of a mobile station, a temperature measurement signals or a signal received from a mobile station accessory.

23. The use of a circuit arrangement according to claim 16 in a mobile station.

24. A mobile station, comprising:

a reception signal path for receiving an RF signal containing received speech signals;

a transmission signal path for inputting speech signals from a microphone and for transmitting a representation of said inputted speech signals;

a digital signal processor for processing received speech signals and for forming said representation of said inputted speech signals;

an analog-to-digital converter having an output coupled to an input of said digital signal processor; and switching circuitry for selectively coupling either an output of said reception signal path or an output of said microphone to an input of said analog-to-digital converter.

25. A mobile station as in claim 24, and further comprising a log amp coupled between at least said output of said microphone and said switching circuitry.

26. A mobile station as in claim 24, wherein said reception signal path is switchably coupled to an input of said log amp in conjunction with said output of said microphone, and wherein said digital signal processor derives a received signal strength indication from a signal received from said reception signal path though said log amp.

27. A circuit arrangement for digital signal processing of two analog input signals (A, D), where the input signals (A, D) are connected to an analog-to-digital converter (24; 31), which converts the input signals to digital form (G, H; K, L), and the converted signals (G, H; K, L) from its output are connected to a digital signal processing circuit (28), whereby the output signals of the digital signal processing circuit (28) are connected to a digital-to-analog converter (45), where the signals are converted back to analog form, characterized in that the circuit arrangement comprises a combining means (44), which by multiplexing combines the digital output signals of the signal processing circuit (28) into a combined digital signal (N), whereby the digital complex signal (N) is connected to the input of the digital-to-analog converter (45), and the combined analog signal resulting from the conversion and appearing as the output of the digital-to-analog converter (45) is directed to separation circuits (46, 47), which separate two separate analog output signals (C, F) from the combined analog signal; wherein a first one of said analog input signals forms a part of a reception signal path and a second one of said analog input signals forms a part of a transmission signal path.

* * * * *